United States Patent
Kasai et al.

(10) Patent No.: US 6,229,731 B1
(45) Date of Patent: May 8, 2001

(54) NONVOLATILE SEMICONDUCTOR MEMORY DEVICE WITH SECURITY FUNCTION AND PROTECT FUNCTION

(75) Inventors: Takamichi Kasai; Nozomi Kasai, both of Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/606,146

(22) Filed: Jun. 29, 2000

(30) Foreign Application Priority Data

Jun. 29, 1999 (JP) ................................................. 11-183228

(51) Int. Cl.[7] ................................................. G11C 16/04
(52) U.S. Cl. ...................... 365/185.04; 365/195; 713/200
(58) Field of Search ........................ 365/185.04, 185.29, 365/195, 196; 395/186; 713/200

(56) References Cited

U.S. PATENT DOCUMENTS

| | | | |
|---|---|---|---|
| 4,821,240 | * 4/1989 | Nakamura et al. .................. | 365/201 |
| 4,974,208 | * 11/1990 | Nakamura et al. ............. | 365/189.01 |
| 5,826,009 | 10/1998 | Feng ...................................... | 395/186 |
| 5,838,901 | 11/1998 | Curd et al. .......................... | 395/186 |
| 5,978,915 | * 11/1999 | Lisart et al. .......................... | 713/200 |
| 6,088,262 | * 7/2000 | Nasu ................................ | 365/185.04 |

FOREIGN PATENT DOCUMENTS

| | | |
|---|---|---|
| 10-222995 | 8/1998 | (JP) . |
| 11-203206 | 7/1999 | (JP) . |

* cited by examiner

Primary Examiner—Son Mai
(74) Attorney, Agent, or Firm—Finnegan, Henderson, Farabow, Garrett & Dunner, L.L.P.

(57) ABSTRACT

The invention provides a flash memory having a security function and a protect function. When the release of the security function has been instructed, all data stored in each block of a flash memory main body is forcibly erased, ignoring the setting of the protect function. After that, the security function is released, thereby enabling readout of data. This being so, even if a third person releases the security function, leakage of data to the outside can be prevented.

16 Claims, 8 Drawing Sheets

NONVOLATILE SEMICONDUCTOR MEMORY DEVICE WITH SECURITY FUNCTION AND PROTECT FUNCTION

CROSS-REFERENCE TO RELATED APPLICATIONS

This application is based upon and claims the benefit of priority from the prior Japanese Patent Application No. 11-183228, filed Jun. 29, 1999, the entire contents of which are incorporated herein by reference.

BACKGROUND OF THE INVENTION

The present invention relates to a semiconductor memory device, and more particularly to a flash memory (flash EEPROM (Electrically Erasable Programmable Read Only Memory)) having a security function and a protect function.

Flash memories are well known as semiconductor memory devices in which On-Board programming can be executed. In order to prevent data stored therein from leaking out or being tampered with, some of the flash memories have means for prohibiting rewrite of the stored data (hereinafter referred to as a "protect function") and means for prohibiting reading of the stored data (hereinafter referred to as a "security function").

The outline of the protect function and the security function employed in the conventional flash memories will be described.

FIG. 1 shows the basic structure of a conventional flash memory having such a protect function. In this flash memory, protect information is stored in a protect information storing circuit 102 that differs from a flash memory main body 101. The protect information is provided for setting a desired one of a stored-data rewrite prohibiting mode (protect-on mode) and a rewrite permitted mode (protect-off mode). The protect information storing circuit 102 is constituted of, for example, a dedicated flash memory (i.e. a fuse cell array).

Writing and erasing of data into and from the flash memory main body 101 is controlled by a state machine 103. The state machine 103 comprises an AND circuit 103a and a write/erase control circuit 103b. When writing or erasing data, the AND circuit 103a generates an AND output (a rewrite signal), which consists of a signal from a command interface 104 and a signal indicating protect information stored in the protect information storing circuit 102. The write/erase control circuit 103b is controlled on the basis of the AND output of the AND circuit 103a.

If "1 (which indicates the protect-off mode)" is stored as the protect information, the AND output is always "1 (which indicates permission)". In this case, rewrite of data stored in the flash memory main body 101 is permitted. On the other hand, if "0 (which indicates the protect-on mode)" is stored as the protect information, the AND output is "0 (which indicates prohibition)". In this case, rewrite of data stored in the flash memory main body 101 is prohibited. Thus, the protect function controls permission/prohibition of rewrite of data stored in the flash memory main body 101 in order to prevent the stored data from being tampered with by any person other than a legitimate user.

In numerous flash memories (not shown) that have the respective memory areas (the memory area of each flash memory main body corresponds to all address areas thereof) of their flash memory main bodies divided into a plurality of blocks, a single protect function can be set for each block. Suppose there is a case where data stored in a certain block (BLK0) of the flash memory main body is program data which is rewritten at a low frequency (or important program data), while data stored in another block (BLK1) is rewritten at a high frequency (or not so important data). For this case, there is an example of use of the protect function, wherein the protect-on mode is set for the block (BLK0) since it is very possible that data damage due to, for example, erroneous writing will be a fatal system error, while the protect-off mode is set for the block (BLK1) because, for example, the setting of the protect information is rather troublesome.

FIG. 2 shows the basic structure of a conventional flash memory having a security function. In this flash memory, security information is stored in a security information storing circuit 105 that differs from a flash memory main body 101. The security information is provided for setting a desired one of a stored-data readout prohibiting mode (security-on mode) and a stored-data readout permitted mode (security-off mode). The security information storing circuit 105 is constituted of, for example, a dedicated flash memory (i.e. a fuse cell array).

Reading data out of the flash memory main body 101 is controlled by a data control circuit 106. The data control circuit 106 comprises an AND circuit 106a and a readout control circuit 106b. When reading out the stored data, the AND circuit 106a generates an AND output (a readout signal), which consists of a signal from the readout control circuit 106b and a signal indicating security information stored in the security information storing circuit 105. On the basis of the AND output of the AND circuit 106a, a tristate buffer 108 interposed between a readout circuit 107 and a data output terminal $D_{out}$ is controlled.

If "1 (which indicates a security-off mode)" is stored as the security information, the AND output is always "1 (which indicates permission)". In this case, the tristate buffer 108 is in an enable state, whereby readout of data from the flash memory main body 101 is permitted. On the other hand, if "0 (which indicates a security-on mode)" is stored as the security information, the AND output is "0 (which indicates prohibition)" irrespective of whether a signal is supplied from the readout control circuit 106b. In this case, the tristate buffer 108 is in a High-Z state (or in a fixed-data output state), thereby prohibiting readout of data from the flash memory main body 101. Thus, the security function controls permission/prohibition of readout of data from the flash memory main body 101 in order to prevent data stored therein from leaking to any person other than a legitimate user. Concerning the security function, a single security function is set, in many cases, for the memory area (all address areas) of the flash memory main body.

FIG. 3 schematically shows the structure of that essential part of the flash memory, which relates to the setting/releasing of the protect function and the security function. A description will be given of an example, where the memory area of the flash memory main body is divided into three blocks.

When setting/releasing the protect function and/or the security function, at first, a sequence of rewriting processing is started for a fuse cell array 201 by the input of an external trigger such as a command. In this state, block information (address information) is input through an address input terminal Add to set/release the protect function. This block information is supplied to a command interface 202 and a write/erase circuit 203. Then, on the basis of the block information, the write/erase circuit 203 turns on/off any of protect cells 102a, 102b and 102c, which are contained in the protect information storing circuit 102 and correspond to respective blocks. By setting the protect information by turning on/off any of the cells 102a, 102b and 102c, the protect function is set/released in units of one block.

To set/release the security function, block information is input through the address input terminal Add after the sequence of rewriting processing is started, and is supplied to the command interface 202 and the write/erase circuit 203. Then, on the basis of the block information, the write/erase circuit 203 turns on/off a security cell 102d contained in the security information storing circuit 105. By setting the security information by turning on/off the cell 102d, the security function is set/released in units of all blocks.

However, if, in the flash memory constructed as above, the security function is released by a third person, it is very possible that they will easily tamper with or leak data stored in the memory.

FIG. 4 illustrates the flow of processing executed by the flash memory of FIG. 3 for releasing the security function. When an instruction to release the security function has been issued, the on/off state of each protect cell 102a, 102b, 102c is checked, thereby sequentially erasing only data stored in a non-protected block (BALK) or non-protected blocks (step ST01–ST03). After that, the security cell 102d is turned off (step ST04), followed by termination of the processing. Thus, in the conventional case, the security function is released without erasing data stored in any protected block. This means that part of the stored data is not erased and can be read out. If a third person releases the security function, they can easily discover the protected data.

After reading out the stored data, the protect cell of a block corresponding to the data is turned off to release its protect function. Then, new data is written into the block, and the protect function is reset, when necessary, by turning on the protect cell.

If, in the conventional case, a third person knows the method for releasing the security function, it is very possible that they will easily tamper with the stored data. At this time, the protect function and the security function become useless.

BRIEF SUMMARY OF THE INVENTION

It is the object of the invention to provide a semiconductor memory device capable of preventing data stored therein from leaking or being tampered with even if a method for releasing the security function is known, thereby significantly enhancing the secrecy of the stored data.

According to a first aspect of the invention, there is provide a semiconductor memory device comprising: programmable non-volatile memory means; at least one rewrite prohibiting means for prohibiting rewrite of data stored in the non-volatile memory means; readout prohibiting means for prohibiting readout of data stored in the non-volatile memory means; and erasure means for erasing data stored in the non-volatile memory means, the erasure means erasing all data stored in the non-volatile memory means when the readout prohibiting means is released, irrespective of whether the rewrite prohibiting means is set.

According to a second aspect of the invention, there is provided a semiconductor memory device comprising: programmable non-volatile memory means; at least one rewrite prohibiting means for prohibiting rewrite of data stored in the non-volatile memory means, the rewrite prohibiting means setting rewrite prohibiting information; readout prohibiting means for prohibiting readout of data stored in the non-volatile memory means, the readout prohibiting means setting readout prohibiting information; release means for releasing the readout prohibiting information set by the readout prohibiting means; and erasure means for erasing all data stored in the non-volatile memory means when the release means releases the readout prohibiting information set by the readout prohibiting means.

According to a further aspect of the invention, there is provided a method of controlling a semiconductor memory device, comprising the steps of: determining whether an instruction to release readout prohibiting means for prohibiting readout of data stored in programmable non-volatile memory means has been issued; erasing the data when release of the readout prohibiting means has been instructed, irrespective of whether the rewrite prohibiting means for prohibiting rewrite of the data is set; and releasing the readout prohibiting means after the data is erased.

According to yet another aspect of the invention, there is provided a recording medium storing a program for controlling a semiconductor memory device, the program comprising: a first step of determining whether an instruction to release readout prohibiting means for prohibiting readout of data stored in programmable non-volatile memory means has been issued; and a second step of erasing the data when release of the readout prohibiting means has been instructed, irrespective of whether the rewrite prohibiting means for prohibiting rewrite of the data is set.

In this invention, all data stored in non-volatile memory means is erased when releasing readout prohibiting means, irrespective of whether rewrite prohibiting means is set. As a result, even if a third person knows the method for releasing the readout prohibiting means, they cannot discover data that was stored and is now lost in the memory means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The embodiments of the invention will be described in detail with reference to the accompanying drawings.

Figure 1:
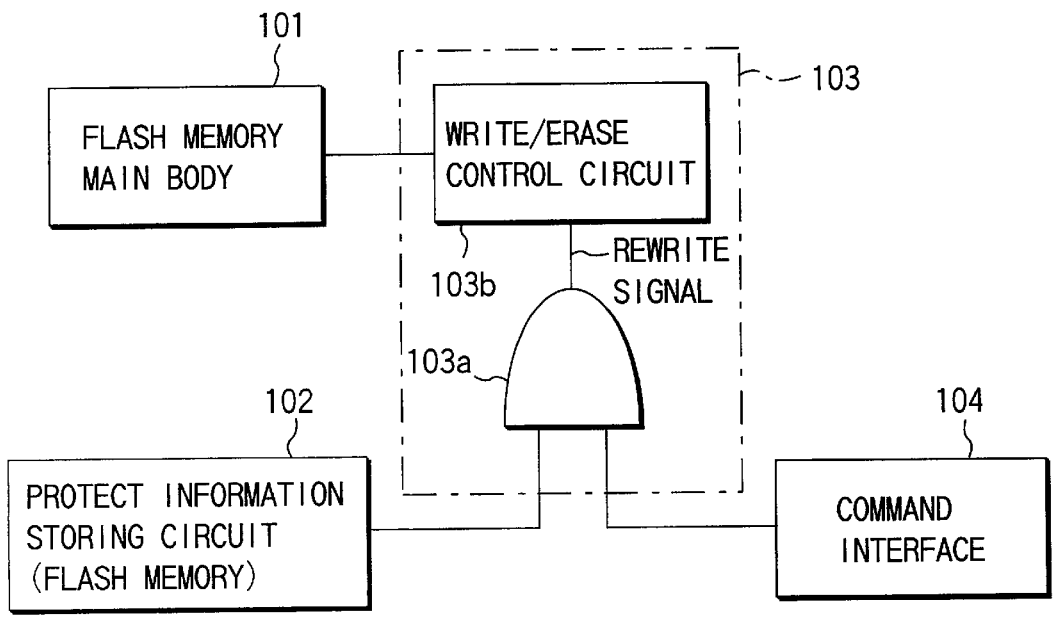
FIG. 1 is a block diagram, showing the basic structure of a conventional flash memory having a protect function, and useful in explaining its problems.
Figure 2:
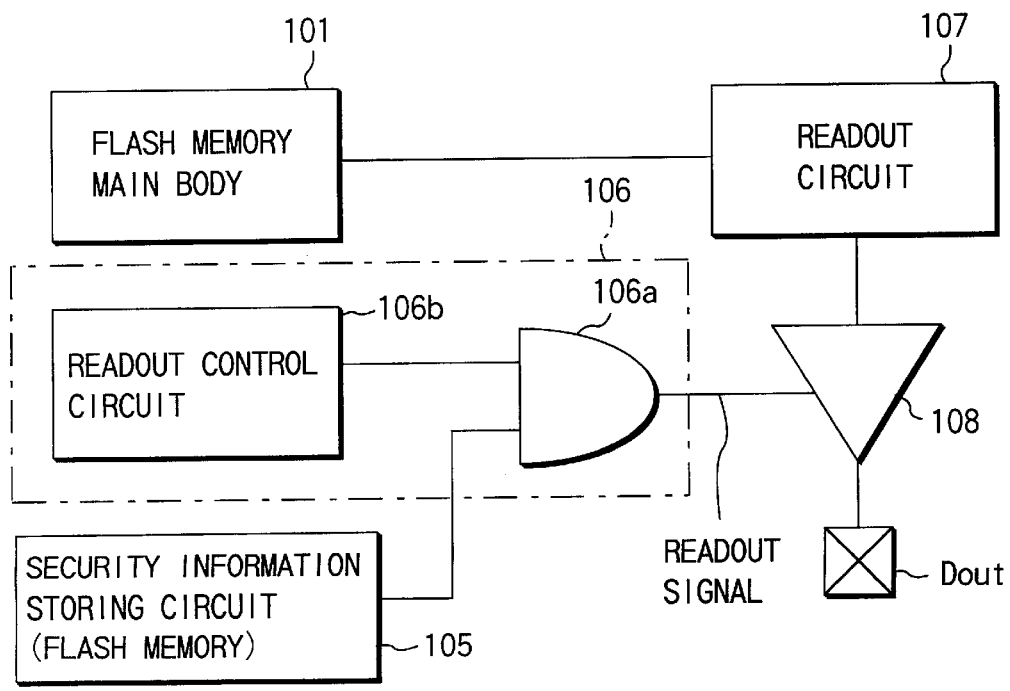
FIG. 2 is a block diagram showing the basic structure of a conventional flash memory having a security fiction.
Figure 3:
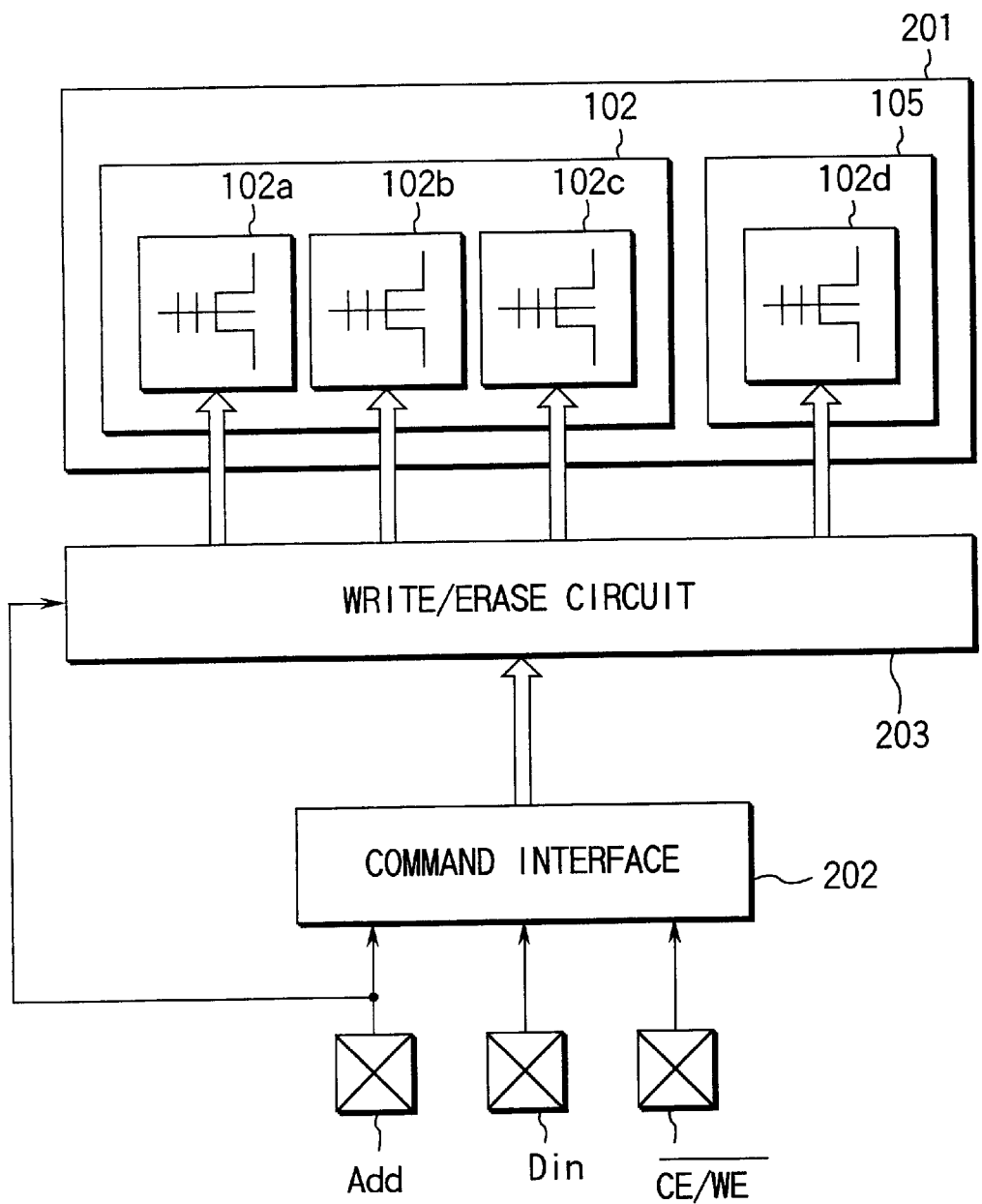
FIG. 3 is a block diagram, showing a conventional flash memory and useful in explaining a method for setting/releasing its protect and security functions.
Figure 4:
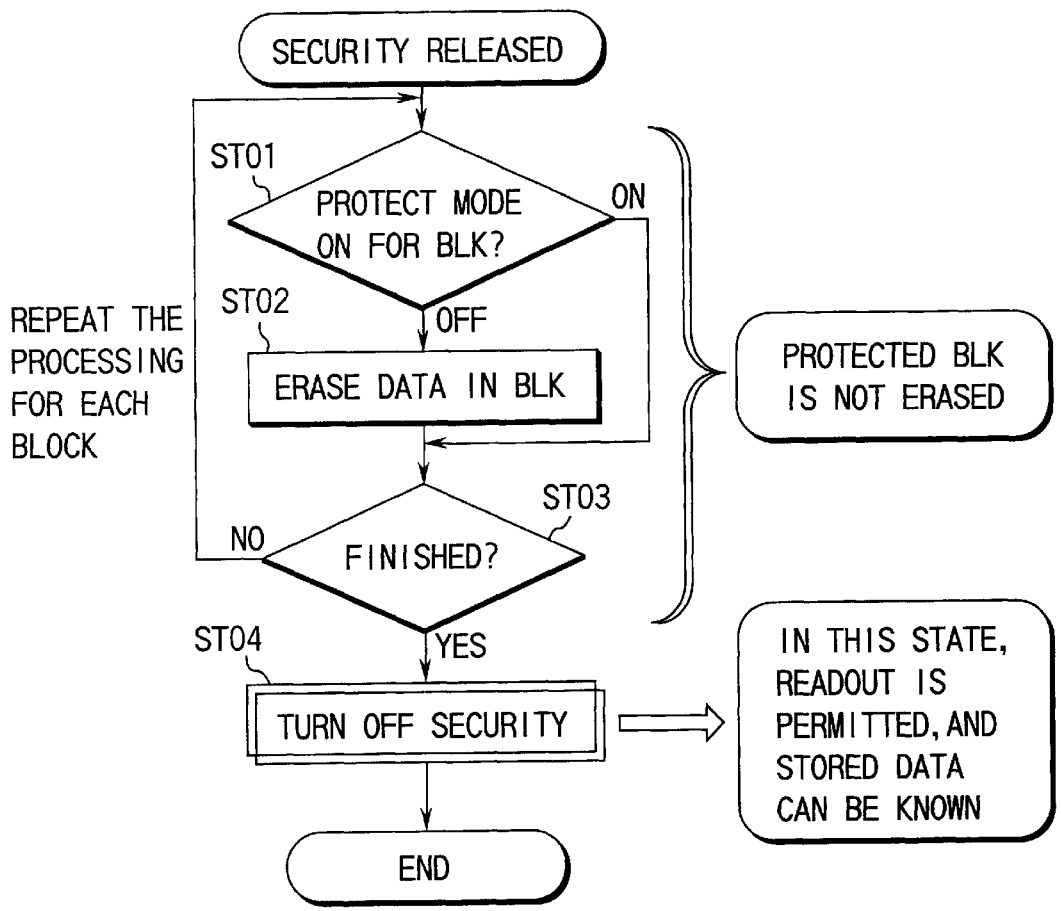
FIG. 4 is a flowchart illustrating the flow of processing for releasing the security function of a conventional flash memory.
Figure 5:
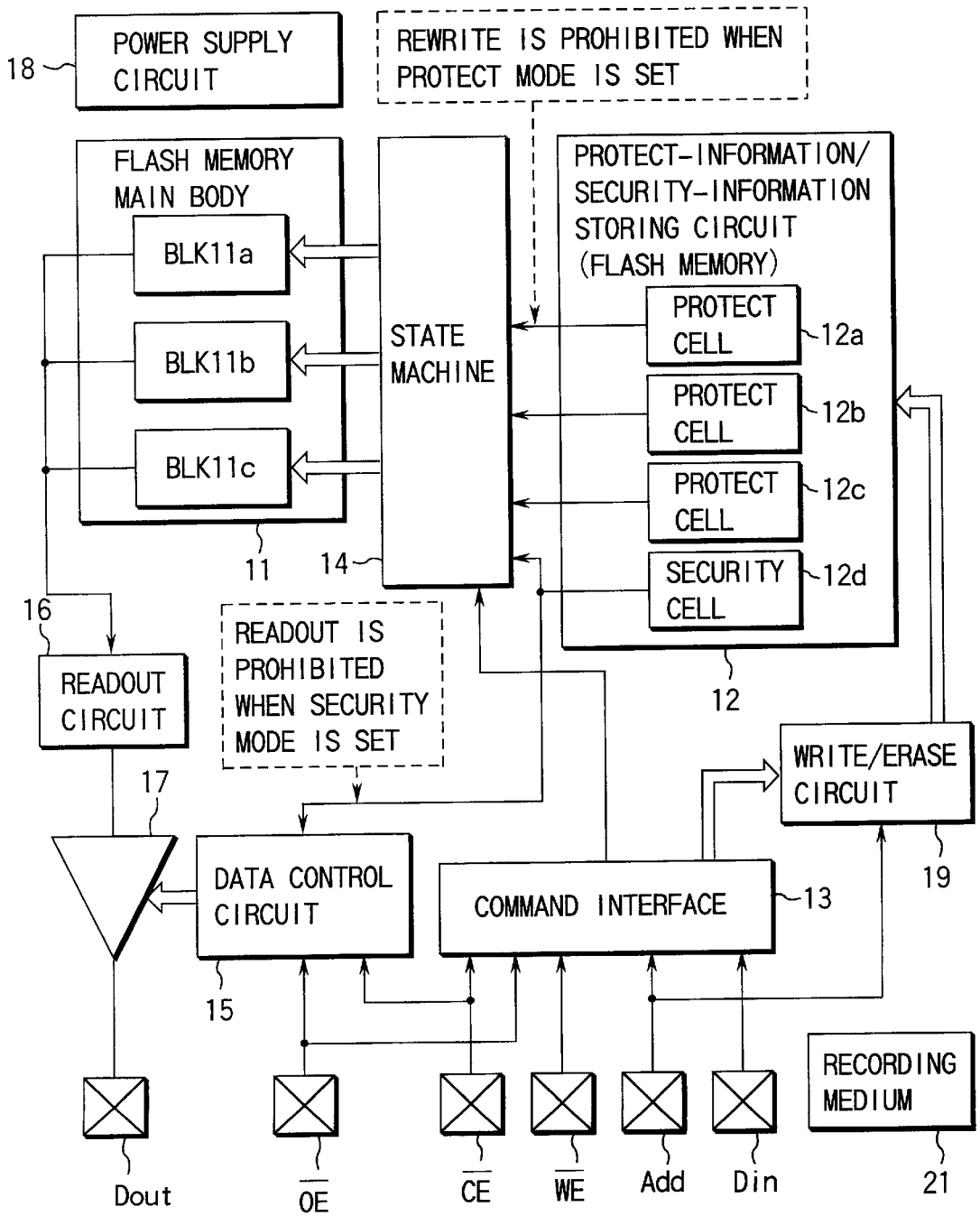
FIG. 5 is a schematic block diagram illustrating the structure of a flash memory according to an embodiment the invention.

FIG. 5 is a schematic block diagram illustrating the structure of an embodiment of the invention using a flash memory as an example. This flash memory comprises, for example, a flash memory main body (programmable non-volatile memory means) 11, a protect-information/security-information storing circuit 12, a command interface 13, a state machine (erasing means) 14, a data control circuit 15, a readout circuit 16, a tristate buffer 17, a power supply circuit 18 and a write/erase circuit (releasing means) 19.

The flash memory main body 11 is adapted to store data, and has its memory area (i.e. all address areas) divided into, for example, three blocks (BLK) 11a, 11b and 11c.

The protect-information/security-information storing circuit 12 is formed of a dedicated flash memory (e.g. a fuse cell array) separate from the flash memory main body 11, and includes protect cells 12a, 12b and 12c and a security cell 12d. The protect cells 12a, 12b and 12c serve as means (rewrite prohibiting means) having a protect function, and store respective protect information items (rewrite prohibiting information items) for prohibiting rewrite of data stored in the blocks 11a, 11b and 11c. The security cell 12d serves as means (readout prohibiting means) having a security function, and stores security information (readout prohibiting information) for prohibiting readout of data stored in the blocks 11a, 11b and 11c.

The command interface 13 is adapted to control the state machine 14 and the write/erase circuit 19 on the basis of signals supplied through an output enable signal input terminal /OE, a chip enable signal input terminal /CE, a write enable signal input terminal /WE, a block information (address information) input terminal Add and a data input terminal $D_{in}$.

The state machine 14 executes writing, erasing and reading of data into and from the flash memory main body 11 on the basis of a signal from the command interface 13 and protect information and security information stored in the protect-information/security-information storing circuit 12. Further, when an instruction to release the security function (to turn off the security mode) is issued, the data stored in all blocks 11a–11c of the flash memory main body 11 are erased, ignoring the protect information.

The data control circuit 15 controls the tristate buffer 17. Specifically, the circuit 15 determines whether or not data read from the flash memory main body 11 should be output to the outside, on the basis of signals from the output enable signal input terminal /OE and the chip enable signal input terminal /CE, and the security information stored in the protect-information/security-information storing circuit 12.

The readout circuit 16 supplies the tristate buffer 17 with data read from each of the blocks 11a–11c of the flash memory main body 11.

The tristate buffer 17 outputs the data supplied from the readout circuit 16, to the data output terminal $D_{out}$ under the control of the data control circuit 15 (i.e. when the circuit 15 permits it). On the other hand, when the data control circuit 15 prohibits the output of the data, the tristate buffer 17 assumes a High-Z state to prevent the output of the data to the data output terminal $D_{out}$ (or to output fixed data to the terminal $D_{out}$).

The power supply circuit 18 generates potentials necessary for various operations, and supplies them to various sections.

The write/erase circuit 19 is arranged to turn on/off each cell 12a, 12b, 12c or 12d in the protect-information/security-information storing circuit 12, and controlled by signals from the command interface 13 and the block information input terminal Add.

The flash memory is constructed to, for example, read a control program stored in a recording medium 21 and execute a predetermined operation described below, in accordance with the read control program.

The operation of the flash memory constructed above will be described briefly. The data-writing, erasing and verifying operations with respect to the flash memory main body 11 are included in the known techniques (i.e. they are basically the same as those of the conventional flash memories), and hence no description is given thereof.

Figure 6:
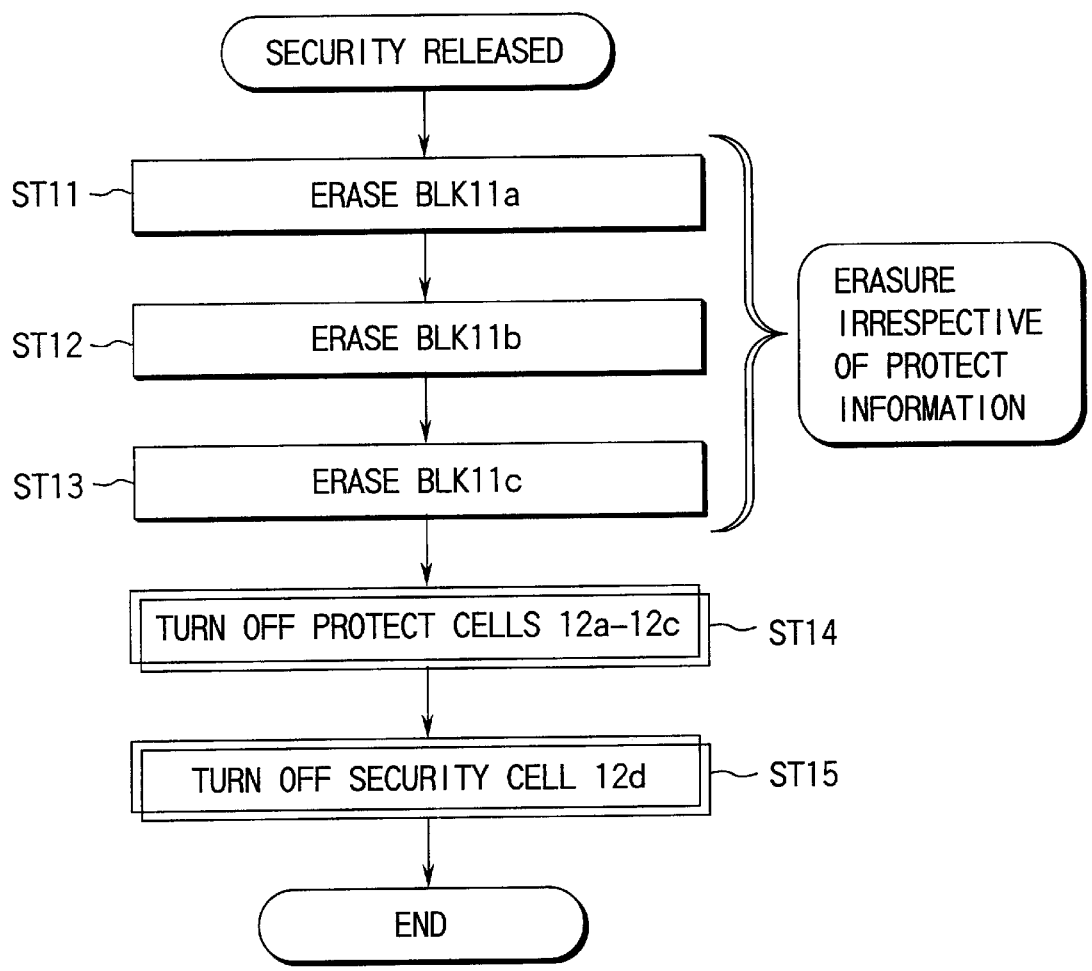
FIG. 6 is a flowchart illustrating the flow of processing for releasing the security function of the flash memory of FIG. 5.

FIG. 6 shows the flow of processing executed by the flash memory of the invention for releasing the security function. Suppose, for example, that an instruction to release the security function (to turn off the security mode) has been input to the command interface 13. Then, the state machine 14 forcibly erases all data stored in each block 11a–11c (steps ST11–ST13). At this time, the state machine 14 ignores protect information (indicating the protect mode) set by each protect cell 12a–12c of the protect-information/security-information storing circuit 12.

Figure 7:
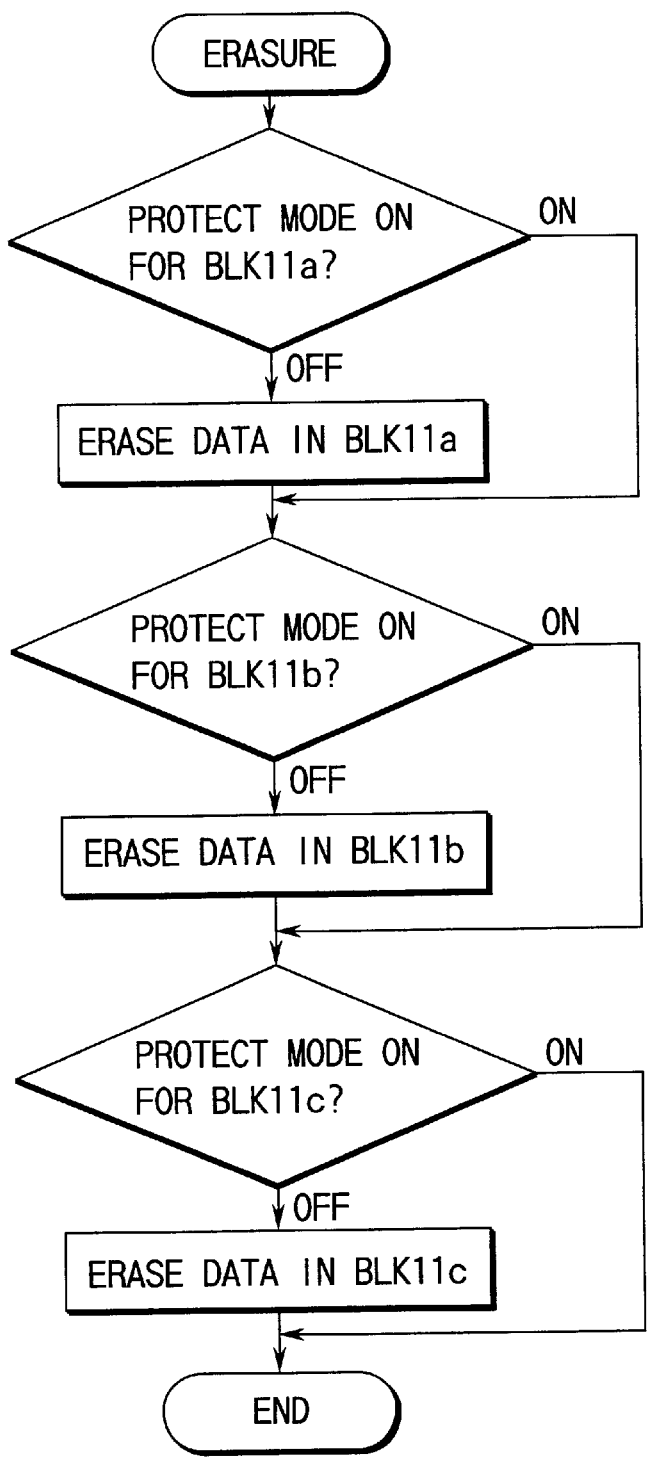
FIG. 7 is a flowchart illustrating the flow of processing for erasing stored data.

The erasure of stored data executed while ignoring the protect information enables erasure of data stored even in a protected block, which cannot be executed in a conventional case as shown in FIG. 7 where only data stored in a non-protected block is erased.

After erasing data stored in all blocks 11a–11c, the write/erase circuit 19 turns off each protect cell 12a–12c. As a result, the protect function for all blocks 11a–11c is released (step ST14). Since the legitimate user needs to write new data, it is advisable to turn off each protect cell 12a–12c after erasing the stored data, in light of the usability of the memory.

Further, the write/erase circuit 19 turns off the security cell 12d, thereby releasing the security function for all blocks 11a–11c (step ST15). This is the termination of the processing.

As described above, when releasing the security function, all data stored in the flash memory main body 11 is erased even if the protect information is set (the protect cells 12a–12c are in the ON state). Thus, where the security function is released to enable the readout of stored data, no more data exists. Therefore, even if someone other than the legitimate user knows the method for releasing the security function, they cannot decode or tamper with the data that was stored but is now lost.

As stated above, when releasing the security function, all data stored in the flash memory main body is erased even if the protect information is set. In other words, the security function is released after all data stored in the flash memory main body is erased. Accordingly, even when a third person has released the security function, they cannot see the data that was stored but is now lost. This means that a third person other than the legitimate user cannot execute data decoding or tampering. Thus, the stored data can be prevented from being tampered with or leaked to the outside, thereby significantly enhancing its security.

In particular, simultaneous execution of erasure of the stored data and turn off of the protect cells enhances the usability of the flash memory by the legitimate user.

Figure 8:
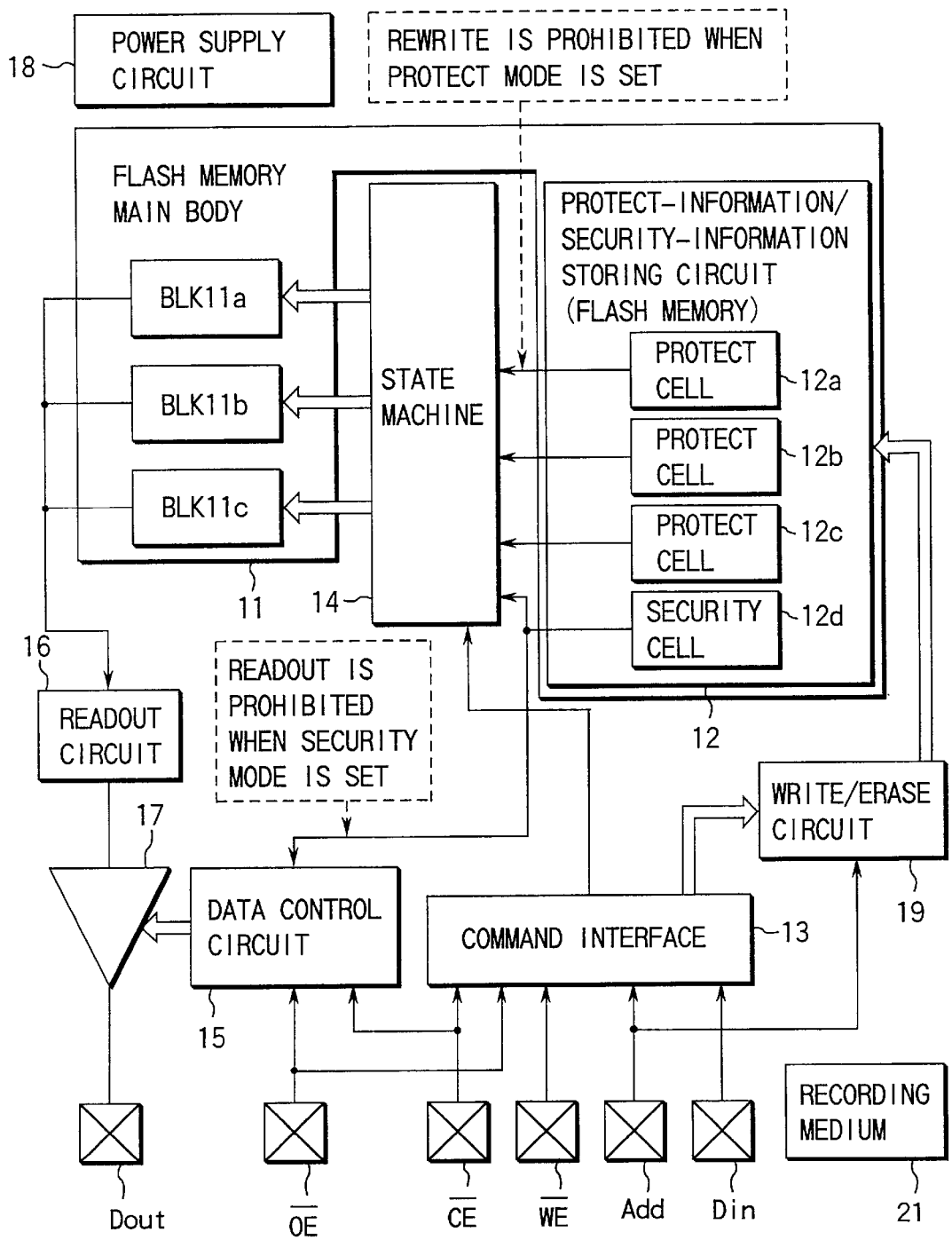
FIG. 8 is a schematic block diagram illustrating the structure of a flash memory according to another embodiment the invention.

In the above-described embodiment of the invention, the protect-information/security-information storing circuit is formed of a fuse cell array separate from the flash memory main body. However, the invention is not limited to this, but the protect-information/security-information storing circuit 12 may be incorporated in the flash memory main body 11 as shown in FIG. 8.

Figure 9:
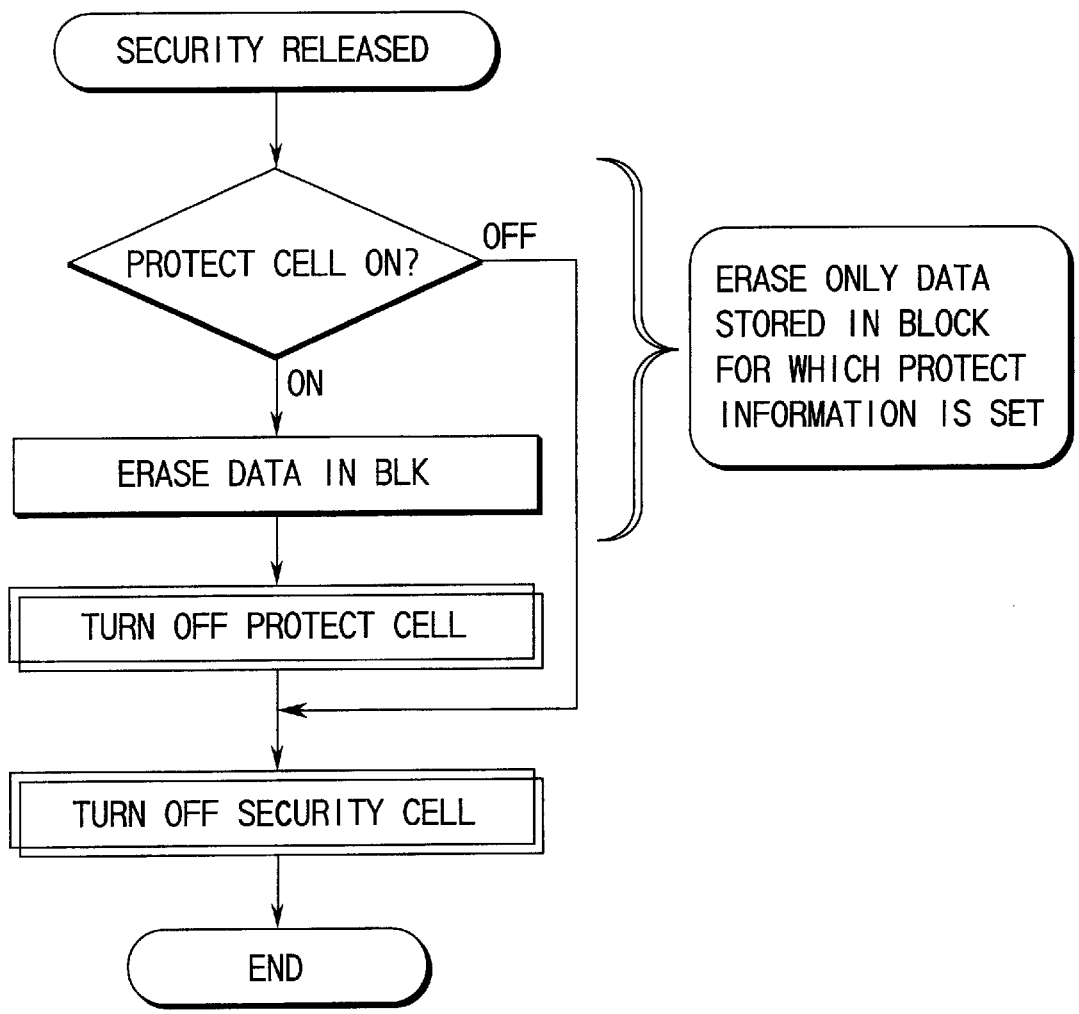
FIG. 9 is a flowchart illustrating the flow of another type of processing for releasing the security function.

In addition to the above-described method for preventing stored data from leaking or being tampered with, another method as shown in FIG. 9 may be employed, in which only data stored in a protected block (or protected blocks) is erased. In this case, at least important data can be prevented from leaking to a third person.

Moreover, instead of erasing the stored data, the stored data may be superscribed with data that is not so important. Also in this case, the stored data can be prevented from leaking to a third person.

Furthermore, where protected data exists, a method for disabling the release of the security function, for example, could be used as another data leakage/tamper preventing method.

It is a matter of course that the invention can be modified in various ways without departing from its scope.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   programmable non-volatile memory means;
   at least one rewrite prohibiting means for prohibiting rewrite of data stored in the non-volatile memory means;
   readout prohibiting means for prohibiting readout of data stored in the non-volatile memory means; and
   erasure means for erasing data stored in the non-volatile memory means, the erasure means erasing all data stored in the non-volatile memory means when the readout prohibiting means is released, irrespective of whether the rewrite prohibiting means is set.

2. The semiconductor memory device according to claim 1, further comprising release means for releasing the readout prohibiting means after all data stored in the non-volatile memory means is erased.

3. The semiconductor memory device according to claim 2, wherein the release means releases the rewrite prohibiting means after all data stored in the non-volatile memory means is erased.

4. The semiconductor memory device according to claim 1, wherein the non-volatile memory means has its memory area divided into a plurality of blocks, and the rewrite prohibiting means can be set for each of the blocks.

5. The semiconductor memory device according to claim 1, wherein the rewrite prohibiting means and the readout prohibiting means have a memory circuit for storing rewrite prohibiting information that prohibits rewrite of the data stored in the non-volatile memory means, and readout prohibiting information that prohibits readout of the data stored in the non-volatile memory means.

6. A semiconductor memory device comprising:
   programmable non-volatile memory means;
   at least one rewrite prohibiting means for prohibiting rewrite of data stored in the non-volatile memory means, the rewrite prohibiting means setting rewrite prohibiting information;
   readout prohibiting means for prohibiting readout of data stored in the non-volatile memory means, the readout prohibiting means setting readout prohibiting information;
   release means for releasing the readout prohibiting information set by the readout prohibiting means; and
   erasure means for erasing all data stored in the non-volatile memory means when the release means releases the readout prohibiting information set by the readout prohibiting means.

7. The semiconductor memory device according to claim 6, wherein the release means releases the readout prohibiting information set by the readout prohibiting means, after all data stored in the non-volatile memory means is erased.

8. The semiconductor memory device according to claim 6, wherein the release means further releases the rewrite prohibiting information set by the rewrite prohibiting means, after all data stored in the non-volatile memory means is erased.

9. The semiconductor memory device according to claim 6, wherein the non-volatile memory means has its memory area divided into a plurality of blocks, and the rewrite prohibiting information can be set by the rewrite prohibiting means for each of the blocks.

10. The semiconductor memory device according to claim 6, wherein the rewrite prohibiting means and the readout prohibiting means have a memory circuit for storing the rewrite prohibiting information and the readout prohibiting information.

11. A method of controlling a semiconductor memory device, comprising the steps of:
    determining whether an instruction to release readout prohibiting means for prohibiting readout of data stored in programmable non-volatile memory means has been issued;
    erasing the data when release of the readout prohibiting means has been instructed, irrespective of whether the rewrite prohibiting means for prohibiting rewrite of the data is set; and
    releasing the readout prohibiting means after the data is erased.

12. The method according to claim 11, further comprising the step of releasing the rewrite prohibiting means after the data is erased.

13. A recording medium storing a program for controlling a semiconductor memory device, the program comprising:
    a first step of determining whether an instruction to release readout prohibiting means for prohibiting readout of data stored in programmable non-volatile memory means has been issued; and
    a second step of erasing the data when release of the readout prohibiting means has been instructed, irrespective of whether the rewrite prohibiting means for prohibiting rewrite of the data is set.

14. The recording medium according to claim 13, wherein the program can be read by the semiconductor memory device.

15. The recording medium according to claim 13, wherein the program further comprises a third step of releasing the rewrite prohibiting means after the data is erased.

16. The recording medium according to claim 13, wherein the program further comprises a third step of releasing the readout prohibiting means after the data is erased.

* * * * *